US009553065B2

(12) United States Patent
Lin et al.

(10) Patent No.: US 9,553,065 B2
(45) Date of Patent: Jan. 24, 2017

(54) BUMPS FOR CHIP SCALE PACKAGING INCLUDING UNDER BUMP METAL STRUCTURES WITH DIFFERENT DIAMETERS

(71) Applicant: Taiwan Semiconductor Manufacturing Company, Ltd., Hsin-Chu (TW)

(72) Inventors: Chun-Hung Lin, Taipei (TW); Yu-Feng Chen, Hsin-Chu (TW); Tsung-Shu Lin, New Taipei (TW); Han-Ping Pu, Taichung (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/204,659

(22) Filed: Mar. 11, 2014

(65) Prior Publication Data

US 2014/0191394 A1    Jul. 10, 2014

Related U.S. Application Data

(63) Continuation of application No. 13/294,859, filed on Nov. 11, 2011, now abandoned.

(51) Int. Cl.
*H01L 23/48* (2006.01)
*H01L 23/52* (2006.01)
(Continued)

(52) U.S. Cl.
CPC .......... *H01L 24/14* (2013.01); *H01L 23/3114* (2013.01); *H01L 23/3171* (2013.01); *H01L 24/05* (2013.01);
(Continued)

(58) Field of Classification Search
None
See application file for complete search history.

(56) References Cited

U.S. PATENT DOCUMENTS 5,569,960 A * 10/1996 Kumazawa et al. .......... 257/738
6,107,685 A    8/2000 Nishiyama
(Continued)

OTHER PUBLICATIONS

Chiang, K., et al., "On Enhancing Eutectic Solder Joint Reliability Using a Second-Reflow-Process Approach," IEEE Transactions on Advanced Packaging, vol. 23, No. 1, Feb. 2000, pp. 9-14.
(Continued)

*Primary Examiner* — Mohammad Islam
*Assistant Examiner* — Jay C Chang
(74) *Attorney, Agent, or Firm* — Slater Matsil, LLP

(57) ABSTRACT

A chip scale semiconductor device comprises a semiconductor die, a first bump and a second bump. The first bump having a first diameter and a first height is formed on an outer region of the semiconductor die. A second bump having a second diameter and a second height is formed on an inner region of the semiconductor die. The second diameter is greater than the first diameter while the second height is the same as the first height. By changing the shape of the bump, the stress and strain can be redistributed through the bump. As a result, the thermal cycling reliability of the chip scale semiconductor device is improved.

18 Claims, 3 Drawing Sheets

(51) Int. Cl.
*H01L 29/40* (2006.01)
*H01L 23/00* (2006.01)
*H01L 23/31* (2006.01)
H01L 21/44 (2006.01)
H01L 23/525 (2006.01)

(52) U.S. Cl.
CPC ............... *H01L 24/06* (2013.01); *H01L 24/17* (2013.01); *H01L 23/525* (2013.01); *H01L 24/03* (2013.01); *H01L 24/13* (2013.01); *H01L 24/16* (2013.01); *H01L 24/81* (2013.01); *H01L 2224/024* (2013.01); *H01L 2224/0233* (2013.01); *H01L 2224/0239* (2013.01); *H01L 2224/02331* (2013.01); *H01L 2224/0345* (2013.01); *H01L 2224/03462* (2013.01); *H01L 2224/0401* (2013.01); *H01L 2224/0508* (2013.01); *H01L 2224/05018* (2013.01); *H01L 2224/05024* (2013.01); *H01L 2224/05085* (2013.01); *H01L 2224/05558* (2013.01); *H01L 2224/05569* (2013.01); *H01L 2224/0603* (2013.01); *H01L 2224/06051* (2013.01); *H01L 2224/06131* (2013.01); *H01L 2224/06135* (2013.01); *H01L 2224/06136* (2013.01); *H01L 2224/13022* (2013.01); *H01L 2224/13024* (2013.01); *H01L 2224/13111* (2013.01); *H01L 2224/1403* (2013.01); *H01L 2224/14131* (2013.01); *H01L 2224/14135* (2013.01); *H01L 2224/14136* (2013.01); *H01L 2224/14179* (2013.01); *H01L 2224/16225* (2013.01); *H01L 2224/17051* (2013.01); *H01L 2224/81191* (2013.01); *H01L 2224/81815* (2013.01); *H01L 2924/00* (2013.01); *H01L 2924/00014* (2013.01); *H01L 2924/351* (2013.01); *H01L 2924/3512* (2013.01)

(56) References Cited

U.S. PATENT DOCUMENTS

| 6,534,875 | B1* | 3/2003 | Nishiyama ........ H01L 23/49838 257/738 |
| --- | --- | --- | --- |
| 7,564,130 | B1 | 7/2009 | Li |
| 2003/0001286 | A1* | 1/2003 | Kajiwara et al. ............. 257/778 |
| 2005/0127508 | A1 | 6/2005 | Lee et al. |
| 2007/0205520 | A1* | 9/2007 | Chou .................. H01L 23/3157 257/780 |
| 2008/0224283 | A1 | 9/2008 | Pu et al. |
| 2009/0250813 | A1* | 10/2009 | Lin et al. ...................... 257/737 |

OTHER PUBLICATIONS

Rajoo, R., et al., "Development of Stretch Solder Interconnections for Wafer Level Packaging," IEEE Transactions on Advanced Packaging, vol. 31, No. 2, May 2008, pp. 377-385.

* cited by examiner

US 9,553,065 B2

1

BUMPS FOR CHIP SCALE PACKAGING INCLUDING UNDER BUMP METAL STRUCTURES WITH DIFFERENT DIAMETERS

This application is a continuation of U.S. patent application Ser. No. 13/294,859, entitled "Bumps for Chip Scale Packaging," filed on Nov. 11, 2011, which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, chip-scale or chip-size packaging based semiconductor devices have emerged as an effective alternative to further reduce the physical size of a semiconductor chip. In a chip-scale packaging based semiconductor device, the packaging is generated on the die with contacts provided by a variety of bumps. Much higher density can be achieved by employing chip-scale packaging based semiconductor devices. Furthermore, chip-scale packaging based semiconductor devices can achieve smaller form factors, cost-effectiveness, increased performance and lower power consumption.

A chip-scale packaging based semiconductor device may comprise a plurality of solder balls formed on a plurality of under bump metal (UBM) openings of a semiconductor die. The solder balls may be formed of tin and lead. Prior to a reflow process, the semiconductor device is picked and placed on a printed circuit board (PCB) after alignment. As a result, the plurality of solder balls on the chip-scale packaging based semiconductor device are aligned with the corresponding solder pads on the PCB board. By employing a hot air flow and appropriate pressure, the solder balls are heated and then melted so as to connect the semiconductor device with the PCB board. The chip-scale packaging technology has some advantages. One advantageous feature of chip-scale packaging is that chip-scale packaging techniques may reduce fabrication costs. Another advantageous feature of chip-scale packaging based multi-chip semiconductor devices is that parasitic losses are reduced by employing bumps sandwiched between a semiconductor device and a PCB board.

BRIEF DESCRIPTION OF THE DRAWINGS

For a more complete understanding of the present disclosure, and the advantages thereof, reference is now made to the following descriptions taken in conjunction with the accompanying drawings, in which.

2

Figure 3:
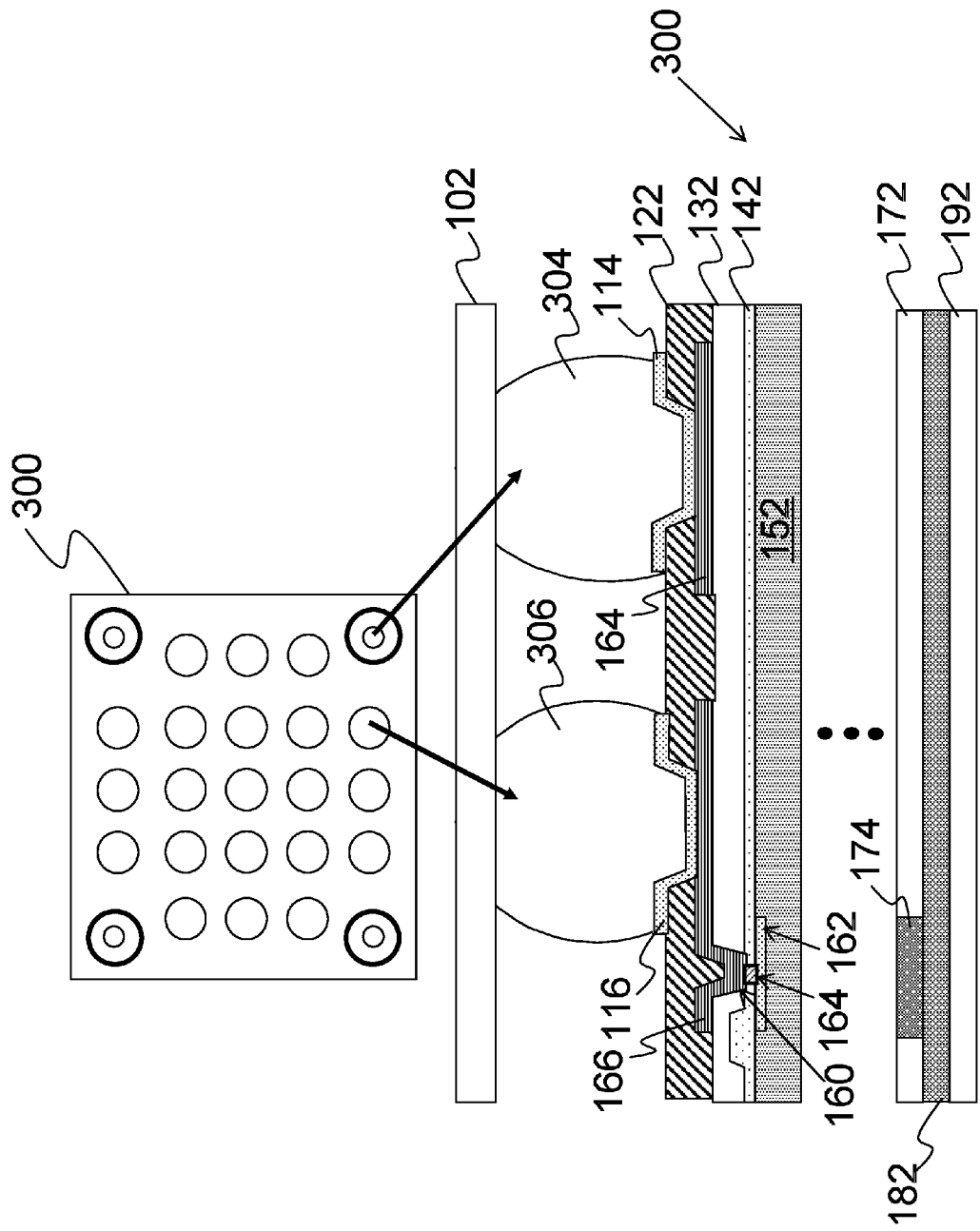

FIG. 3 illustrates a top view and a cross sectional view of a bump structure having a chip scale packaging feature in accordance with yet another embodiment.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a bump design technique for a chip scale package. The disclosure may also be applied, however, to a variety of packages of the semiconductor industry.

Figure 1:
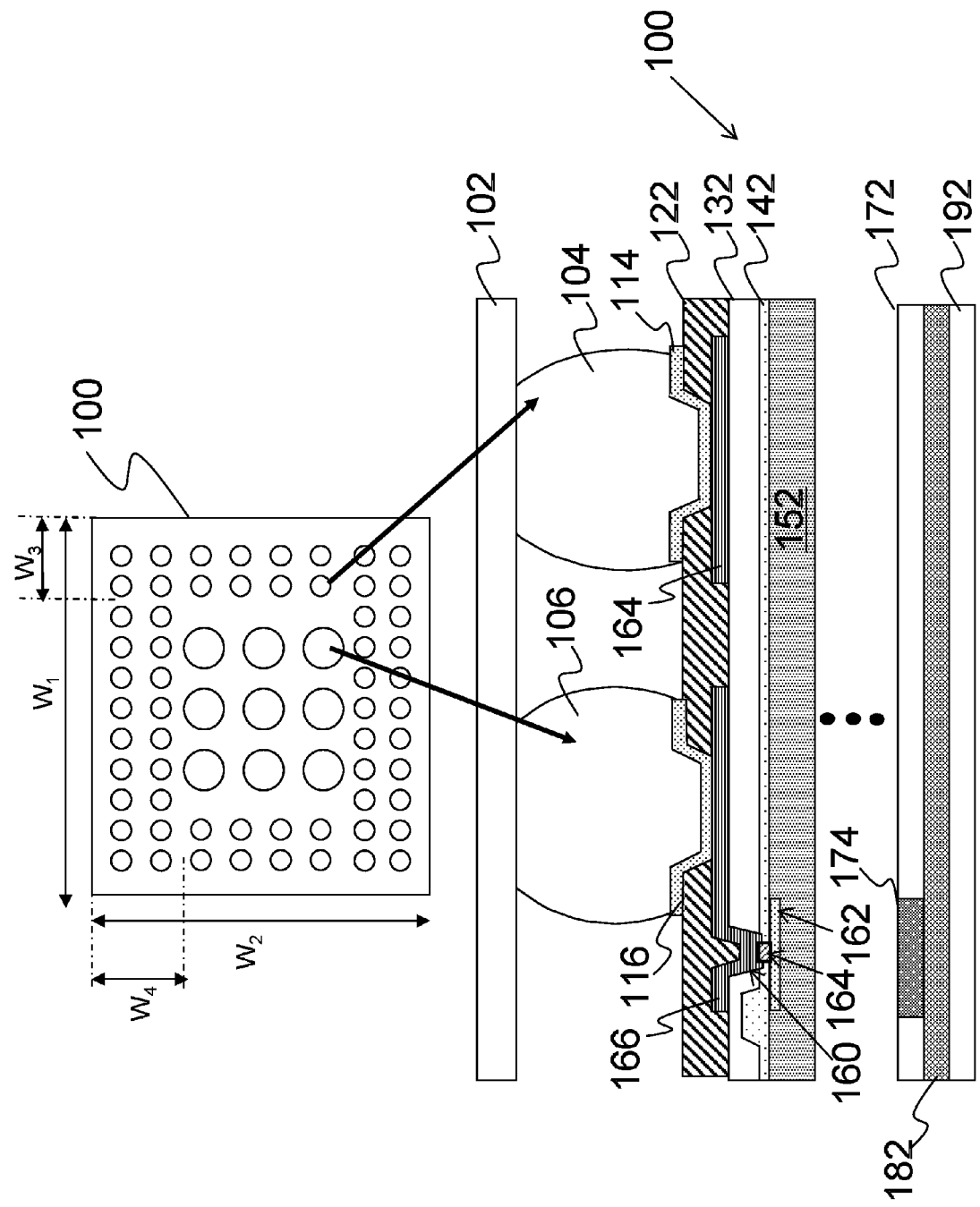
FIG. 1 illustrates a top view and a cross sectional view of a bump structure having a chip scale packaging feature in accordance with an embodiment.

Referring initially to FIG. 1, a top view and a cross sectional view of a bump structure having a chip scale packaging feature is illustrated in accordance with an embodiment. As shown in FIG. 1, the bump structure is formed on a semiconductor die 100. The semiconductor die 100 comprises a substrate 192. The substrate 192 may be a silicon substrate. Alternatively, the substrate 192 may be a silicon-on-insulator substrate. The substrate 192 may further comprise a variety of electrical circuits (not shown). The electrical circuits formed on the substrate 192 may be any type of circuitry suitable for a particular application.

In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An interlayer dielectric layer 182 is formed on top of the substrate 192. The interlayer dielectric layer 182 may be formed, for example, of a low-K dielectric material, such as silicon oxide. The interlayer dielectric layer 182 may be formed by any suitable method known in the art, such as spinning, chemical vapor deposition (CVD) and plasma enhanced chemical vapor deposition (PECVD). It should also be noted that one skilled in the art will recognize that the interlayer dielectric layer 182 may further comprise a plurality of dielectric layers.

A bottom metallization layer 172 and a top metallization layer 152 are formed over the interlayer dielectric layer 182. As shown in FIG. 1, the bottom metallization layer 172 comprises a first metal line 174. Likewise, the top metallization layer 152 comprises a second metal line 162. Metal lines 174 and 162 are formed of metal materials such as copper or copper alloys and the like. It should be noted while FIG. 1 shows the bottom metallization layer 172 and the top metallization layer 152, one skilled in the art will recognize that one or more inter-metal dielectric layers (not shown) and the associated metallization layers (not shown) are formed between the bottom metallization layer 172 and the top metallization layer 152. Generally, the one or more inter-metal dielectric layers and the associated metallization layers are used to interconnect the electrical circuits in the substrate 192 to each other and to provide an external electrical connection.

A passivation layer 142 is formed on top of the top metallization layer 152. In accordance with an embodiment, the passivation layer 142 is formed of non-organic materials such as un-doped silicate glass, silicon nitride, silicon oxide and the like. An aluminum pad 160 may be formed on top of the passivation layer 142. Furthermore, the aluminum pad 160 may be connected to the top metal line 162 through a via hole 164. In accordance with an embodiment, the via hole 164 is fully filled with metallic materials such as copper, copper alloys, aluminum, silver, gold and any combinations thereof. The via hole 164 may be formed by suitable techniques such as CVD. Alternatively, the via hole 164 may formed by sputtering, electroplating and the like.

A first polymer layer 132 is formed on top of the passivation layer 142. The first polymer layer 132 is made of polymer materials such as epoxy, polyimide and the like. The first polymer layer 132 may be made by any suitable method known in the art such as spin coating. A redistribution layer 166 is formed on the first polymer layer 132. As shown in FIG. 1, the redistribution layer 166 connects the aluminum pad 160 with the top surface of the semiconductor die 100. More particularly, the redistribution layer 166 provides a conductive path between the metal lines (e.g., metal line 162) and the top surface of the semiconductor die 100 (e.g., UBM 116).

A second polymer layer 122 is formed on top of the first polymer layer 132. As shown in FIG. 1, both the redistribution layer 166 and the redistribution layer 164 are embedded in the second polymer layer 122. The redistribution layer 166 and the redistribution layer 164 are formed of metal materials such as aluminum, aluminum alloys, copper or copper alloys and the like. The second polymer layer 122 is patterned to form a plurality of openings. Furthermore, various under bump metal (UBM) structures (e.g., UBM 116) are formed on top of the openings. The UBM structures (e.g., UBM 116) are employed to connect the redistribution layers (e.g., redistribution layer 166) with various input and output terminals (e.g., bumps 106 and 104). Each UBM structure may further comprise a variety of sub-layers such as a seed layer (not shown), an adhesion layer (not shown) and/or the like. The UBM structures may be formed by any suitable techniques such as evaporation, electroplating and the like.

Bumps 104 and 106 are formed on top of the UBM structures 114 and 116 respectively. In accordance with an embodiment, the bumps 104 and 106 are solder balls. Throughout the description, for simplicity, bumps 104 and 106 are alternatively referred to as solder balls 104 and 106 respectively. The solder balls 104 and 106 may be made of any of suitable materials. In accordance with an embodiment, the solder balls 104 and 106 comprise SAC405. SAC405 comprises 95.5% Sn, 4.0% Ag and 0.5% Cu.

As shown in FIG. 1, after a reflow process, both solder balls 104 and 106 are heated and subsequently melted so as to connect the semiconductor die 100 with a printed circuit board (PCB) 102. It should be noted that the PCB 102 may have a different thermal expansion coefficient from the solder balls 104 and 106 as well as the semiconductor die 100. As a result, such a different thermal expansion coefficient may cause a relatively large stress and plastic strain at the solder joint between the solder balls 104, 106 and the PCB 102. Furthermore, the large stress and plastic strain accumulated over a plurality of temperature cycles on the solder balls 104 and 106 may lead to cracks in the solder joint areas between the solder balls 104, 106 and the PCB 102.

In order to redistribute the stress and strain described above evenly across the body of the solder balls (e.g., solder ball 104), solder balls on the top surface of a semiconductor die 100 may be configured such that an inner region comprises large solder balls (e.g., solder ball 106) and an outer region comprises small solder balls (e.g., solder ball 104). A top view of the semiconductor die 100 illustrates a solder ball layout in accordance with an embodiment. In the top view, the semiconductor die 100 is of a horizontal length W1 and a vertical length W2.

On the top surface of the semiconductor die 100, there may be a variety of solder balls formed on their corresponding UBM structures. As shown in FIG. 1, a plurality of small solder balls (e.g., solder ball 104) are formed on the outer region of the semiconductor die 100. Likewise, a plurality of large solder balls (e.g., solder ball 106) are formed on the inner region of the semiconductor die 100. It should be noted that in accordance with an embodiment, "a small solder ball" means its diameter is less than 90% of that of "a large solder ball." In other words, when a large solder ball has a diameter of about 300 um, the corresponding small solder ball has a diameter equal to or less than 270 um. One advantageous feature of having small solder balls formed on the outer region of the semiconductor die 100 is that the small solder balls allow the semiconductor die 100 to have a fine pitch package as well as addition input and output terminals.

Furthermore, in accordance with an embodiment, the diameter of the small solder balls before a reflow process should be greater than the height of the large solder balls after the reflow process. For example, prior to a reflow process, the diameters of a large solder ball and a small solder ball are 250 um and 225 um respectively. After a reflow process, both solder balls are melted and sandwiched between the top surface of the semiconductor die 100 and the PCB 102. The height of the large solder ball after a reflow process is about 210.5 um. Therefore, by controlling the distance between the PCB 102 and the semiconductor die 100, reliable solder joints formed by small solder balls can be achieved.

There may be a variety of ways to define the border between an inner region and an outer region. In accordance with an embodiment, an outer region comprises four edge regions. Each edge region has a width (e.g., $W_3$ and $W_4$) approximately equal to or less than 20% of the corresponding length (e.g., $W_1$ and $W_2$) of the semiconductor die 100. By employing different solder balls on the top surface of the semiconductor die 100, after a reflow process, the outer bumps (e.g., solder ball 104) are thinner in comparison with their inner counterparts (e.g., solder ball 106). As a result, the stress derived from the thermal expansion difference between the PCB 102 and the semiconductor die 100 may be redistributed across the body of the solder ball 104 so that the possibility of cracks may be reduced. One advantageous feature of having small solder balls at the outer region of the semiconductor die 100 is that the small solder balls help to redistribute the stress and strain so as to improve thermal cycling reliability. In accordance with an embodiment, the accumulative plastic strain during one cycle of the temperature cycling test (TCT) at the solder joint between the semiconductor die 100 and the PCB 102 can be reduced by 16%.

Figure 2:
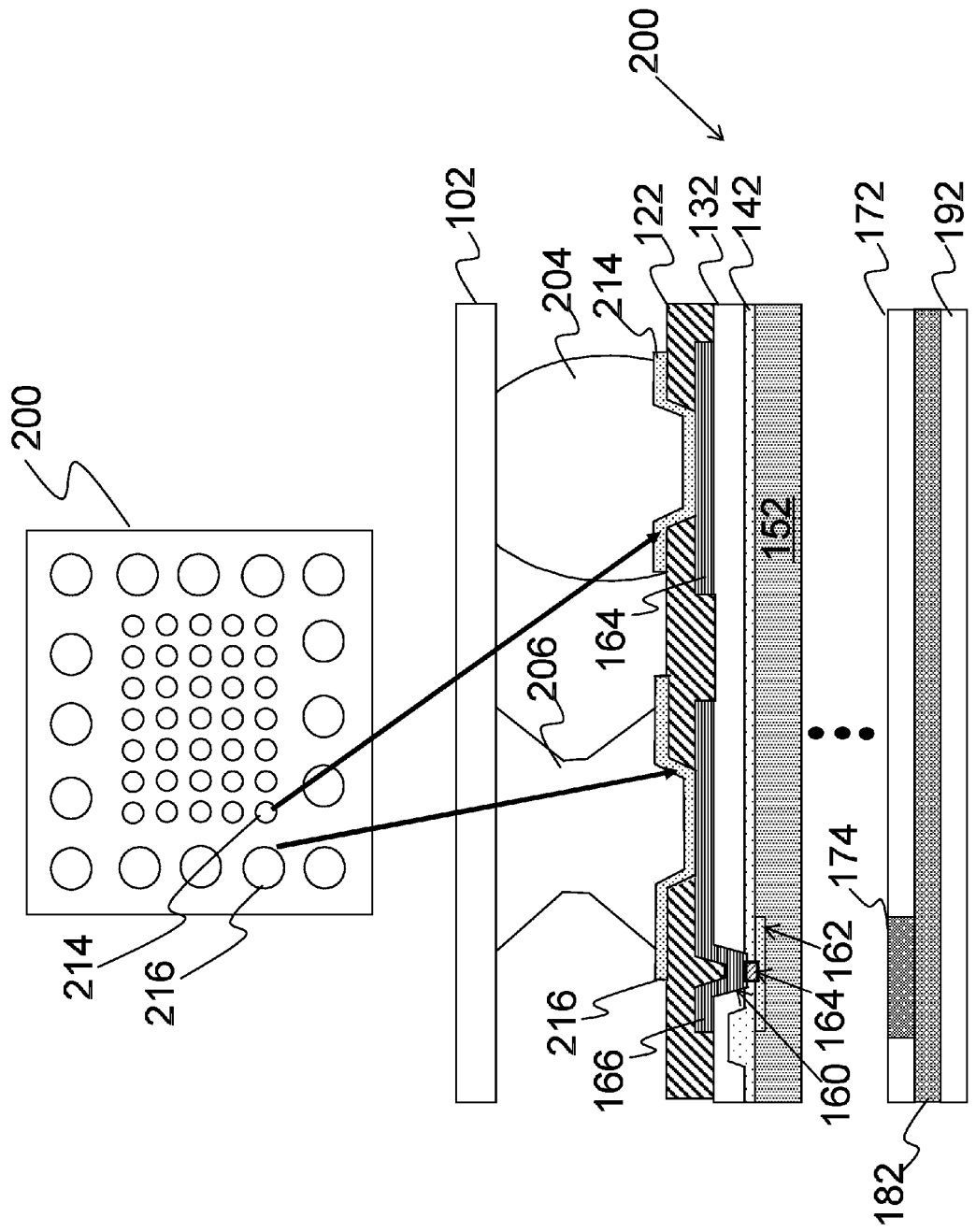
FIG. 2 illustrates a top view and a cross sectional view of a bump structure having a chip scale packaging feature in accordance with another embodiment.

FIG. 2 illustrates a top view and a cross sectional view of a bump structure having a chip scale packaging feature in accordance with another embodiment. The structure of the semiconductor die 200 shown in FIG. 2 is similar to the semiconductor die 100 shown in FIG. 1 except that the UBM structures (e.g., UBM structure 216) of the semiconductor die 200 is different from the UBM structures (e.g., UBM structure 116) of the semiconductor die 100. As shown in the top view (solder balls are removed in order to illustrate the UBM difference), a plurality of large UBM structures (e.g., UBM structure 216) are employed in the outer region of the semiconductor die 200. In contrast, a plurality of small UBM structures are employed in the inner region. In accordance with an embodiment, the small UBM structures (e.g., UBM structure 214) has a diameter less than or equal to 90% of that of the large UBM structures (e.g., UBM structure 216).

In accordance with an embodiment, solder balls (e.g., solder 204 and 206) having substantially identical size are formed on the UBM structures having different diameters. As a result, the solder balls at different regions may have different shapes after a reflow process. More particularly, the solder ball formed on a large UBM structure is stretched during a reflow process in comparison with the solder ball formed on a small UBM structure. As shown in FIG. 2, the solder balls (e.g., solder ball 206) formed on the outer region may have an hourglass shape. In contrast, the solder balls (e.g., solder ball 204) formed on the inner region may have a spherical shape. Such an hourglass shaped solder column sandwiched between the semiconductor die 200 and the PCB 102 helps to reduce the stress at the solder joint between the semiconductor die 200 and the PCB 102.

FIG. 3 illustrates a top view and a cross sectional view of a bump structure having a chip scale packaging feature in accordance with yet another embodiment. The structure of the semiconductor die 300 shown in FIG. 3 is similar to the semiconductor die 100 shown in FIG. 1 except that the allocation of smaller solder balls of the semiconductor die 300 is different from that of the semiconductor die 100. As shown in the top view, four small solder balls are formed on the four corners of the integrated chip die 300. In contrast, large solder balls are formed in the inner region. For similar reasons described above with respect to FIG. 1, the small solder balls of the semiconductor die 300 help to reduce the stress and strain at the solder joints between the small solder balls and the PCB 102 so as to reduce the possibility of cracks and improve thermal cycling reliability.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a semiconductor die comprising a substrate, electrical circuits formed along a first side of the substrate and a redistribution layer over the first side of the substrate;
   a plurality of under bump metal structures arranged in rows and columns on a center region of a top surface of the substrate;
   a first under bump metal structure formed in a first region of the semiconductor die, wherein the first under bump metal structure is of a first diameter and a bottom of the first under bump metal structure is in direct contact with the redistribution layer, and wherein the first under bump metal structure is electrically connected to the electrical circuits through a first metal line in a bottom metallization layer, a second metal line in a top metallization layer, a via in a passivation layer, an aluminum pad in a first polymer layer and the redistribution layer;
   a second under bump metal structure formed in a second region of the semiconductor die, wherein the second under bump metal structure is of a second diameter and a bottom of the second under bump metal structure is in direct contact with the redistribution layer, and wherein the second under bump metal structure and the first under bump metal structure are immediately adjacent to each other;
   a third under bump metal structure having a third diameter formed in the second region of the semiconductor die, wherein the second under bump metal structure and the third under bump metal structure are in a same row and immediately adjacent to each other, and wherein the third diameter is equal to the second diameter and the first diameter is greater than the second diameter;
   a fourth under bump metal structure having the first diameter, wherein the fourth under bump metal structure and the first under bump metal structure are in an outermost column of the plurality of under bump metal structures and are immediately adjacent to each other;
   a fifth under bump metal structure having the first diameter, wherein the fourth under bump metal structure and the fifth under bump metal structure are in an outermost row of the plurality of under bump metal structures and are immediately adjacent to each other, and wherein a distance between the fourth under bump metal structure and the fifth under bump metal structure is greater than a distance between the second under bump metal structure and the third under bump metal structure;
   a first bump formed over the first under bump metal structure; and
   a second bump formed over the second under bump metal structure, wherein a top surface of the first bump is level with a top surface of the second bump, and wherein a first sidewall of an edge portion of the second under bump metal structure is covered by the second bump and a second sidewall of the edge portion of the second under bump metal structure is not covered by the second bump.

2. The device of claim 1, wherein:
   the first region is an outer region of the semiconductor die; and
   the second region is an inner region of the semiconductor die.

3. The device of claim 2, wherein:
the outer region has a width approximately equal to or less than one third of a width of the inner region.

4. The device of claim 2, wherein:
the second diameter is less than or equal to 90% of the first diameter.

5. The device of claim 1, wherein:
the first bump is formed of solder; and
the second bump is formed of solder.

6. The device of claim 1, wherein:
the first bump is of an hourglass shape.

7. The device of claim 1, wherein:
the second bump has a diameter greater than a diameter of the first bump.

8. A device comprising:
a semiconductor die comprising a substrate, electrical circuits formed along a first side of the substrate and a redistribution layer over the first side of the substrate, wherein the redistribution layer comprising a redistribution line;
a first under bump metal structure formed adjacent to an edge of the semiconductor die and over the first side of the substrate, wherein the redistribution layer is connected between an aluminum pad and a bottom of the first under bump metal structure, and wherein the first under bump metal structure is electrically connected to the electrical circuits through a first metal line in a bottom metallization layer, a second metal line in a top metallization layer, a via in a passivation layer, the aluminum pad in a first polymer layer and the redistribution line;
a second under bump metal structure formed not adjacent to the edge of the semiconductor die, wherein the first under bump metal structure has a diameter greater than a diameter of the second under bump metal structure;
a first bump formed over the first under bump metal structure, wherein a sidewall of the first bump comprises a first slope portion, a vertical sidewall portion and a second slope portion, and wherein an edge portion of the first under bump metal structure is not completely covered by the first bump, and wherein the edge portion of the first under bump metal structure extends from an outermost edge of the redistribution line to an outermost edge of the first under bump metal structure; and
a second bump formed over the second under bump metal structure, wherein the second bump is of a spherical shape, and wherein a top surface of the first bump is level with a top surface of the second bump, and wherein a first sidewall of an edge portion of the second under bump metal structure is covered by the second bump and a second sidewall of the edge portion of the second under bump metal structure is not covered by the second bump.

9. The device of claim 8, wherein:
the second bump has a diameter greater than a diameter of the first bump.

10. The device of claim 8, wherein:
the first under bump metal structure is formed on an outer region of the semiconductor die; and
the second under bump metal structure is formed on an inner region of the semiconductor die.

11. The device of claim 10, wherein:
the outer region has a width approximately equal to or less than one third of a width of the inner region.

12. A device comprising:
a plurality of small under bump metal structures arranged in rows and columns on a center region of a top surface of a substrate, wherein the plurality of small under bump metal structures are of a same diameter;
a first row of large under bump metal structures between a first edge of the center region and a first edge of the substrate, wherein the first row comprises a first under bump metal structure and a second under bump metal structure adjacent to each other;
a second row of large under bump metal structures between a second edge of the center region and a second edge of the substrate, wherein the first edge and the second edge of the center region are on opposite sides of the center region;
a first column of large under bump metal structures between a third edge of the center region and a third edge of the substrate, wherein the first column comprises the first under bump metal structure and a third under bump metal structure adjacent to each other;
a second column of large under bump metal structures between a fourth edge of the center region and a fourth edge of the substrate, wherein the third edge and the fourth edge of the center region are on opposite sides of the center region, and wherein a distance between two immediately adjacent large under bump metal structures is greater than a distance between two immediately adjacent small under bump metal structures, and
wherein each of the large under bump metal structures has a diameter greater than a diameter of each of the small under bump metal structures;
a redistribution line under and in contact with a large under bump metal structure;
a first bump formed over the large under bump metal structure, wherein an edge portion of the large under bump metal structure is not completely covered by the first bump, and wherein the edge portion of the large under bump metal structure extends from an outermost edge of the redistribution line to an outermost edge of the large under bump metal structure; and
a second bump formed over a small under bump metal structure, wherein a first sidewall of an edge portion of the small under bump metal structure is covered by the second bump and a second sidewall of the edge portion of the small under bump metal structure is not covered by the second bump.

13. The device of claim 12, wherein:
a top surface of the first bump is level with a top surface of the second bump.

14. The device of claim 12, wherein:
the small under bump metal structure is immediately next to the large under bump metal structure.

15. The device of claim 12, wherein:
the first under bump metal structure is at a corner of the top surface of the substrate.

16. The device of claim 12, wherein:
large under bump metal structures of the first row, the second row, the first column and the second column are of a same diameter.

17. The device of claim 12, wherein:
the first bump is of an hourglass shape.

18. The device of claim 12, wherein:
the second bump is of a spherical shape.

* * * * *